United States Patent [19]

Golomb

[11] Patent Number: 5,332,405

[45] Date of Patent: Jul. 26, 1994

[54] APPARATUS FOR MANUFACTURING SEMICONDUCTOR LEAD FRAMES IN A CIRCULAR PATH

[76] Inventor: Mark S. Golomb, 22231 Bitter Oak St., Cupertino, Calif. 95014

[21] Appl. No.: 938,931

[22] Filed: Sep. 1, 1992

[51] Int. Cl.$^5$ .............. H01L 21/68; B23P 23/00; B26D 5/00; B26D 7/06
[52] U.S. Cl. .................. 29/25.01; 29/564; 29/33 Q; 83/404.2; 83/733; 83/410.7; 83/914
[58] Field of Search .......... 72/358; 83/404.1, 404.2, 83/404.3, 405, 733, 410.7, 914; 29/564, 563, 566.3, 33 Q, 25.01; 414/744.3, 744.5

[56] References Cited

U.S. PATENT DOCUMENTS

| | | | |
|---|---|---|---|
| 3,698,061 | 10/1972 | La Valle | 29/203 D |
| 3,881,607 | 5/1975 | Lewis | 414/744.8 |
| 4,287,748 | 9/1981 | Wolfthal | 72/405 |
| 4,301,581 | 11/1981 | Bader et al. | 29/38 |
| 4,627,159 | 12/1986 | Waldner | 29/827 |
| 4,638,144 | 1/1987 | Latta, Jr. | 219/121 LH |
| 4,885,837 | 12/1989 | Eshima et al. | 29/564 |
| 4,987,673 | 1/1991 | Kogura et al. | 29/564 |
| 5,038,453 | 8/1991 | Kurita et al. | 29/25.01 |
| 5,046,389 | 9/1991 | Thompson et al. | 83/140 |

Primary Examiner—Olik Chaudhuri
Assistant Examiner—David E. Graybill
Attorney, Agent, or Firm—Flehr, Hohbach, Test, Albritton & Herbert

[57] ABSTRACT

An apparatus for processing semiconductor lead frames is described which comprises a plurality of stations arranged in a substantially circular path for processing the lead frames. The apparatus further includes processing means located at each station for processing the lead frames and transferring means for transferring the lead frames between stations for processing. The processing means includes a removable die module for housing tool kits which work the lead frames and which can be replaced to process different types of lead frames or to produce a different product from the lead frames.

18 Claims, 4 Drawing Sheets

APPARATUS FOR MANUFACTURING SEMICONDUCTOR LEAD FRAMES IN A CIRCULAR PATH

BACKGROUND OF THE INVENTION

This invention relates generally to semiconductors and, more particularly, to an apparatus for processing semiconductor lead frames, including single semiconductor packages. The invention also relates to a method of processing semiconductor lead frames, including single semiconductor packages.

Integrated circuit chips are currently utilized in a wide variety of applications including computers, automobiles, video cassette recorders (VCR's), stereos, etc. After integrated circuit chips are manufactured, they are mounted to lead frames for further processing before they can be utilized for a specific application. The integrated circuit chips are mounted to lead frames by bonding the lead wires of the lead frame to the terminals of the integrated circuit. Then, each integrated circuit chip and its associated lead wires are encapsulated in a housing by a molding operation. The lead frames are then subjected to a multi-step process to create individual integrated circuits or "packages" for specific applications.

One step in this process consists of punching out and removing the portions of the frame, called dam bars, which initially provide support for the leads of the lead frame. The dam bars are removed to electrically isolate the frame leads from each other. Generally, this process is accomplished with a die machine. Prior to the dam bar step, small lateral projections on the sides of the molded housing, called flashing, which are created by the molding operation, must be removed. The flashing must be removed to prevent them from jamming the die machine during the dam bar step. This step is called deflash. The leads of the lead frame must then be cut to a constant length. This step is called trimming. Next, the leads of the lead frame are formed by cutting the tie-bars which connect adjacent leads and bending the leads to the desired configuration. Since the leads must conform to very strict tolerances after forming, the angles and dimensions of the formed leads are checked. This step is called checking. Finally the molded resin body is cut from the lead frame, or singulated, to provide an individual semiconductor product which is placed in a package or holder. The single semiconductor product must also be marked with a product number and a product name. If any mistakes occur in the processing of the lead frame, it may be possible to reprocess the lead frame in order to correct these mistakes. This step is called lead conditioning. Some of these steps are generally shown in U.S. Pat. No. 5,038,453, U.S. Pat. No. 4,885,837, and U.S. Pat. No. 4,627,159.

The standard apparatus used for manufacturing semiconductor lead frames includes a linear track along which are positioned a plurality of stations housing tools for accomplishing the steps of the multi-step process described above. As the lead frame travels along the track, the tools at the stations interact with the lead frame to accomplish a specific task of this process. This type of apparatus has proven to work; however, there are many disadvantages of such a system. It is difficult to increase productivity because only one or two packages on the lead frame can be processed at any one time at a station. If a linear machine were to be modified to process more packages at each station, such as processing the whole lead frame simultaneously at each station, the length of the machine would be too large. Also, if it is desired to perform a different task at a station, it is necessary to replace the whole die, which is time consuming and expensive, since the die accounts for a large percentage of the cost of the machine. In order to avoid replacing the dies to perform a different task at a station, dies which perform all of the desired tasks can be installed along the track. However, this also results in a machine which is too large. The dies at each station must also be replaced if it is desired to use the apparatus to process lead frames with different pitch distances between packages. Therefore, there is a need for an apparatus for processing lead frames which has an increased processing yield which occupies a minimum amount of space. There is also a need for an apparatus for processing lead frames which can be quickly and inexpensively retooled to perform different processing steps at each station and to process different types and lengths of lead frames. In this connection, there is a need for such an apparatus which can process a single semiconductor package.

SUMMARY OF THE INVENTION

The present invention relates to an apparatus for processing semiconductor lead frames having an increased processing yield and which can be quickly and inexpensively adjusted to process different types of lead frames, including a single package, or produce different products from the same lead frame. The present invention also relates to an apparatus for processing semiconductor lead frames with an output which can be quickly adjustable from as low as one semiconductor package to a high number, and to an apparatus for processing semiconductor lead frames with a reduced footprint.

The apparatus comprises a plurality of stations arranged in a substantially circular path for processing semiconductor lead frames. The plurality of stations includes an on-load station for receiving the semiconductor lead frames at the commencement of the manufacturing cycle, a plurality of working stations for processing the semiconductor lead frames, and an off-load station for removing the processed semiconductor lead frame and resulting product at the end of the manufacturing cycle. The length of the stations is sufficient to allow for simultaneous processing of the entire semiconductor lead frame at the station. This feature greatly increases the processing yield of the machine. Located adjacent to the on-load station and off-load station are an on-load mechanism and an off-load mechanism for respectively on-loading and off-loading the semiconductor lead frames from the machine. A rotatable mechanism having a plurality of wing arms for each of the stations is positioned at a point substantially close to the center of the circular path for transferring the semiconductor lead frames from one station to another for processing. At the end of each wing arm is a changeable arm for positioning semiconductor lead frames on the end of one of the wing arms. The semiconductor lead frames are transferred from one station to another by raising the rotatable mechanism so that the semiconductor lead frame is removed from the current station, rotating the rotatable mechanism so that the movable arm is now at an angular position along the circular path equal to the angular position of the next station, and lowering the rotatable mechanism such that the semiconductor device on the changeable arm is positioned at the next station. The circular configuration reduces the amount of space required to house the machine.

Each of the stations includes a removable die module containing the tool kits and arms which work on the semiconductor lead frames. Releasable clamps and fasteners, which secure the die module to the station, allow for the die module to be easily removed and installed, thereby making it possible to perform a different task at the station and produce different products by simply replacing the tool kits contained in the die module. Also, the production rate can be increased or decreased by simply installing or removing tool kits in the die module. To maximize production, the number of tool kits installed in the die module is set equal to the number of individual circuits (packages) on the semiconductor lead frame such that the entire semiconductor lead frame can be processed simultaneously at each station. Also, to reduce the tooling cost, or to simply process a single circuit (package), only one tooling kit can be installed in the die module, such that only one individual circuit (package) is worked on at a time at each station. In this configuration, only one circuit (package) on the semiconductor lead frame is processed during one cycle through the machine. To work the circuits (packages) in the other locations, the die module is removed, the tool kit is moved to a position in the die module corresponding to the pitch position of the next circuit (package), and the semiconductor lead frame is cycled through the machine.

Other features and advantages of the invention either will become apparent or will be described connection with the following, more detailed description of the preferred embodiment of the invention, taken in conjunction with the accompanying drawings.

It is recognized that using a circular configuration for manufacturing is not new. However, it would not be obvious to one skilled in the art to employ a circular configuration for semiconductor lead frame processing.

BRIEF DESCRIPTION OF THE DRAWINGS

With reference to the accompanying drawings.

DETAILED DESCRIPTION OF THE PREFERRED EMBODIMENT(S)

The following relatively detailed description is provided to satisfy the patent statutes. However, it will be appreciated by those skilled in the art that various changes and modifications can be made without departing from the invention. The following description is exemplary, rather than exhaustive.

Figure 1:
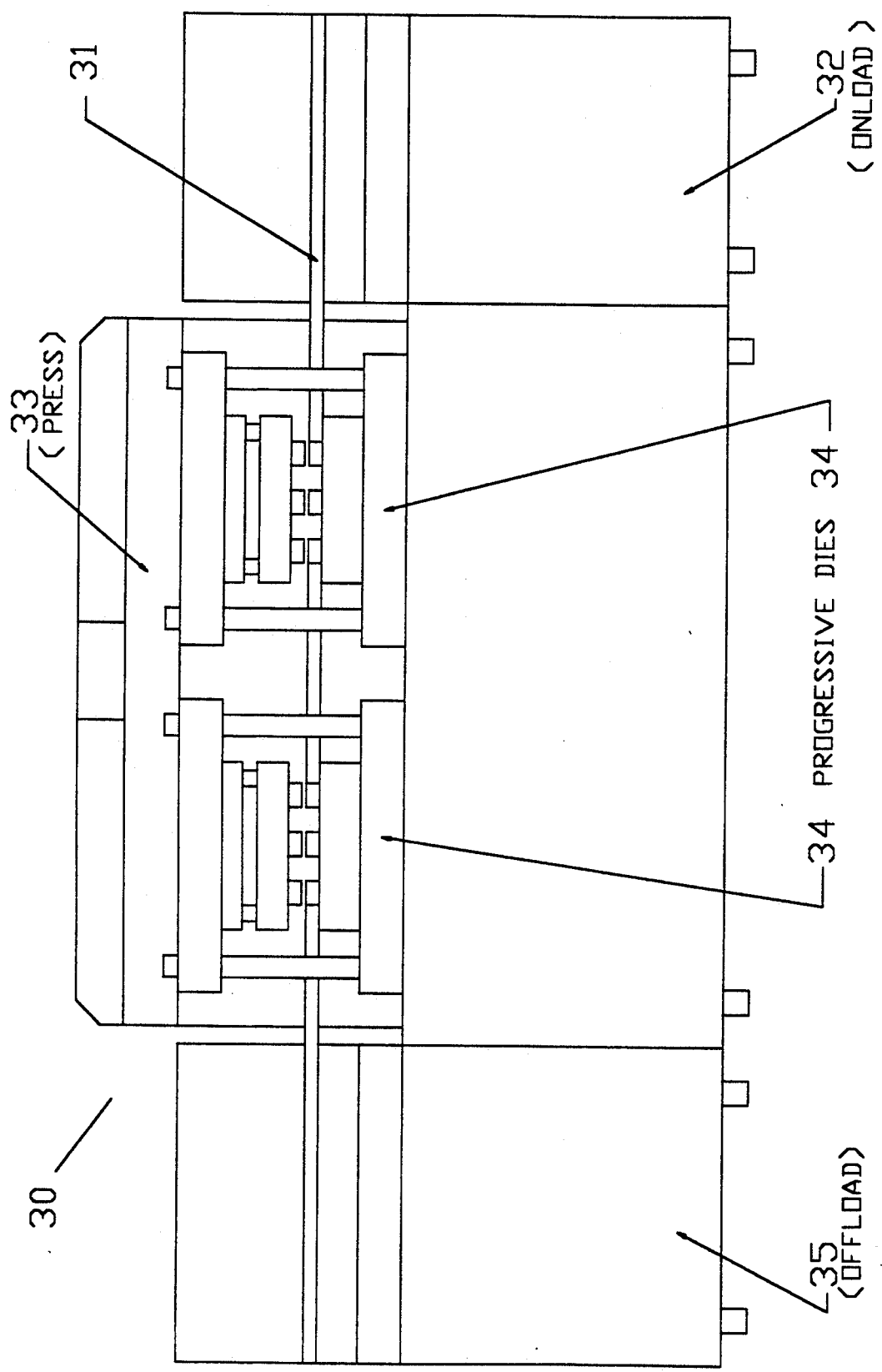
FIG. 1 shows a prior art apparatus for processing lead frames.

FIG. 1 shows a conventional prior art apparatus for processing semiconductor lead frames. The apparatus of FIG. 1 generally indicated by the reference numeral 30 includes a linear track 31 along which the semiconductor lead frame travels through the apparatus. An on-load mechanism 32 is positioned at one end of the linear track for receiving the semiconductor lead frames and transferring the lead frames to the apparatus for processing. A press is generally indicated by the reference numeral 33 for operating the progressive dies 34 which process the semiconductor lead frames. An off-loading mechanism 35 is positioned at the end of the linear track 31 for removing the processed semiconductor lead frames from the apparatus.

Figure 2:
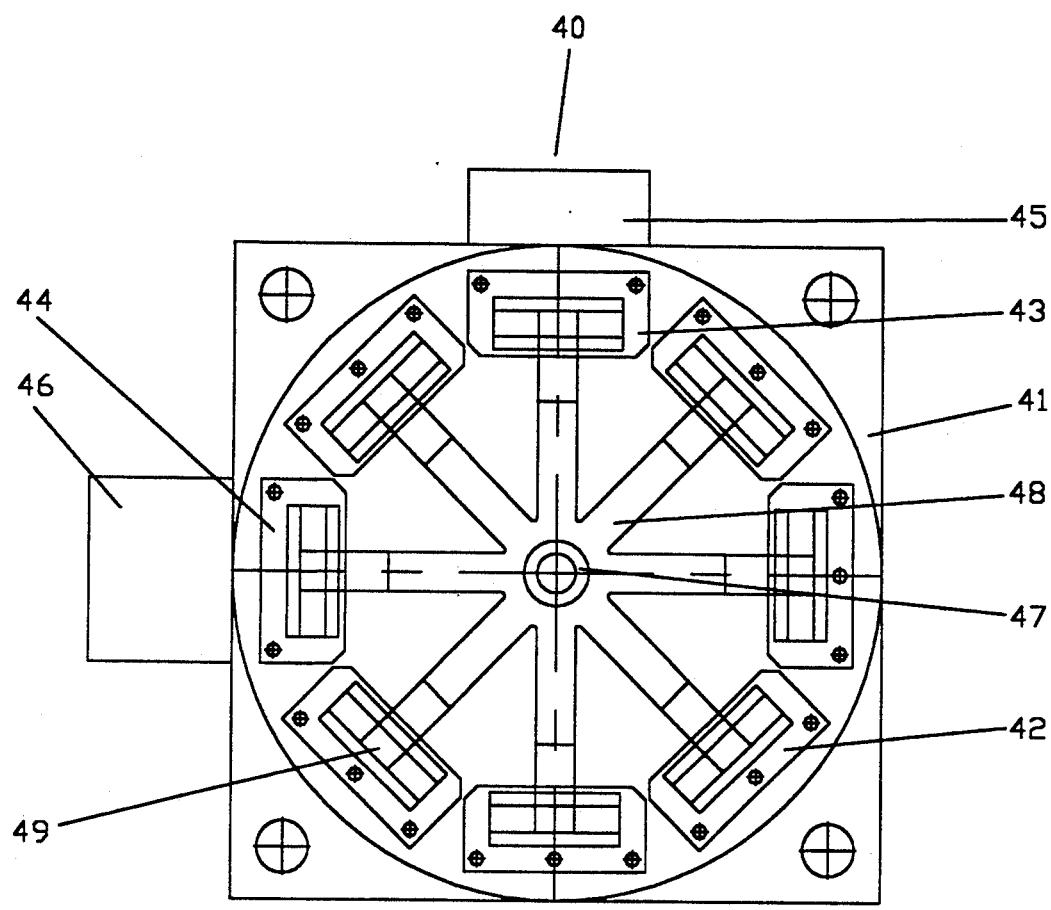
FIG. 2 shows an overall top view of a preferred embodiment of the present invention.

FIG. 2 shows a top view of a preferred embodiment of the present invention. The apparatus generally shown at 40 includes a bottom base plate 41 supporting a plurality of work stations of the type indicated by reference numeral 42 arranged in a substantially circular path for processing semiconductor lead frames. Each station can be configured to perform a step in the processing of semiconductor lead frames. Some of theses steps include deflashing, dambaring, trimming, forming, marking, checking, singulating, or lead conditioning. With the proper number of stations and the proper tools at each station, all of the steps in a desired processing cycle can be accomplished in one cycle through the apparatus. This circular configuration reduces the amount of space required to support the apparatus 40. The lengths of the stations 42, indicated by lower case letter 1 in FIG. 2, are long enough to be able to hold an entire semiconductor lead frame. This feature greatly increases the processing yield of the apparatus because the entire semiconductor lead frame can be processed simultaneously at each station. Most desirably, this dimension should be 14 inches to accommodate a lead frame up to 10 inches. With 8 such stations, the dimensions of the bottom base plate 41 is 50 inches by 50 inches.

The plurality of stations includes an on-load station 43 for receiving the semiconductor lead frames at the commencement of the manufacturing cycle, and an off-load station 44 for removing the processed lead frames at the end of the manufacturing cycle. Located adjacent to the on-load station and off-load station is an on-load mechanism 45 and an off-load mechanism 46 for respectively on-loading and off-loading the semiconductor lead frames from the machine. It should be noted that different types of on-load and off-load mechanisms can be used and also that they can be located at any position relative to the apparatus provided that they are able to effectively on-load and off-load the semiconductor lead frames from the processing apparatus.

Figures 3A, 3B:
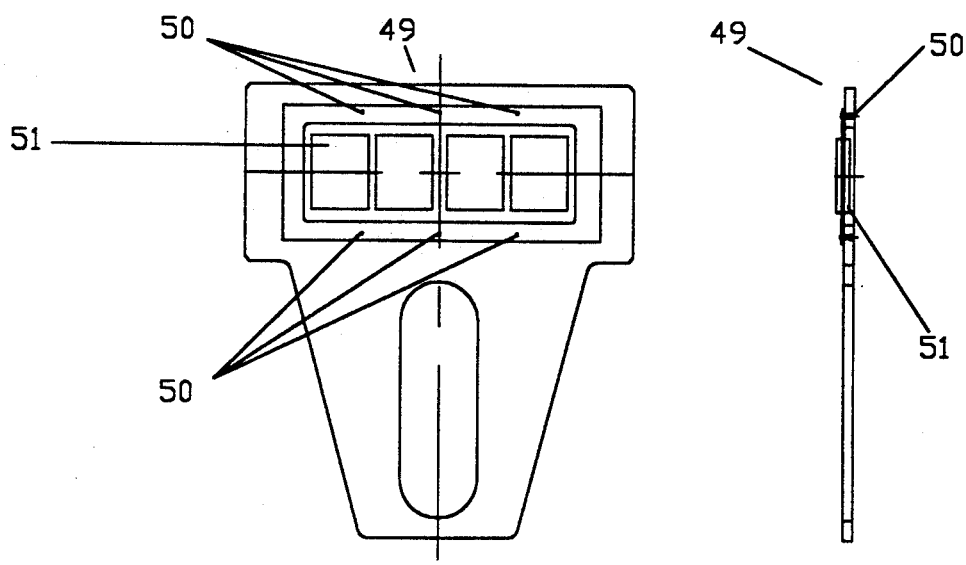
FIG. 3A is a top view of the changeable arm of the apparatus of FIG. 2.
FIG. 3B is a side view of the changeable arm of FIG. 3A.

A rotatable mechanism 47 having a plurality of wing arms identical to that indicated by reference numeral 48 for each of the stations is positioned at a point substantially close to the center of the circular path for transferring the semiconductor lead frames from one station to another for processing. At the end of each wing arm is a changeable arm 49 for securing the semiconductor lead frames at the end of the wing arms and positioning the semiconductor lead frames at one of the plurality of stations. The semiconductor lead frame is transferred from one station to another by raising the rotatable mechanism so that the lead frame is removed from the current station, rotating the rotatable mechanism so that the movable arm is now at an angular position along the circular path equal to the angular position of the next station, and lowering the rotatable mechanism such that the semiconductor lead frame on the movable arm is positioned at the next station. As shown in FIGS. 3A and 3B, the changeable arm 49 includes positioning pins 50 for securing the semiconductor lead frame 51 to the changeable arm as the lead frame is cycled through the processing apparatus 40.

Figure 4A:
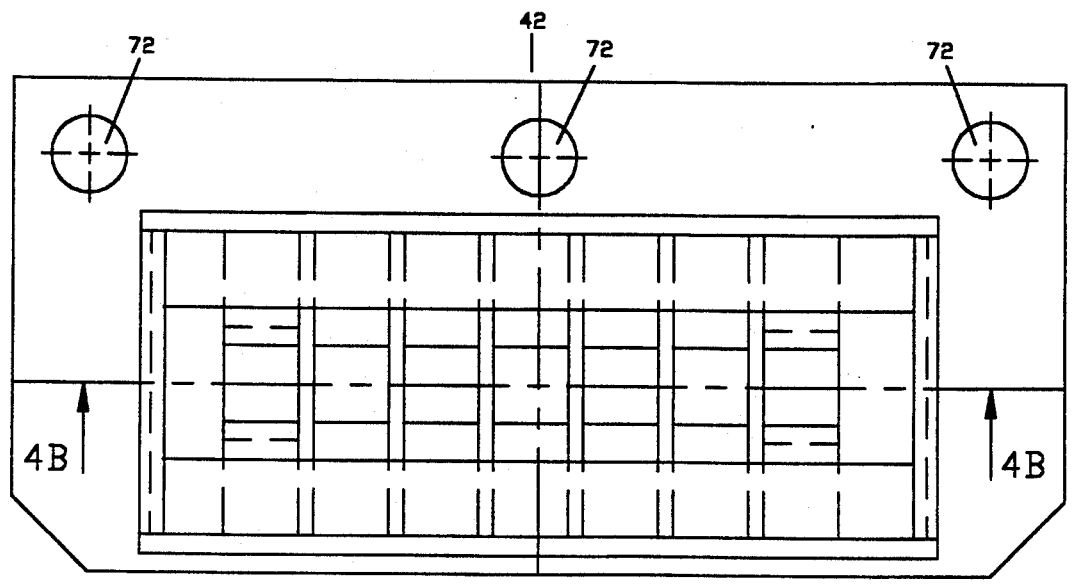
FIG. 4A is a top view of one of the stations shown in FIG. 2.
Figure 4B:
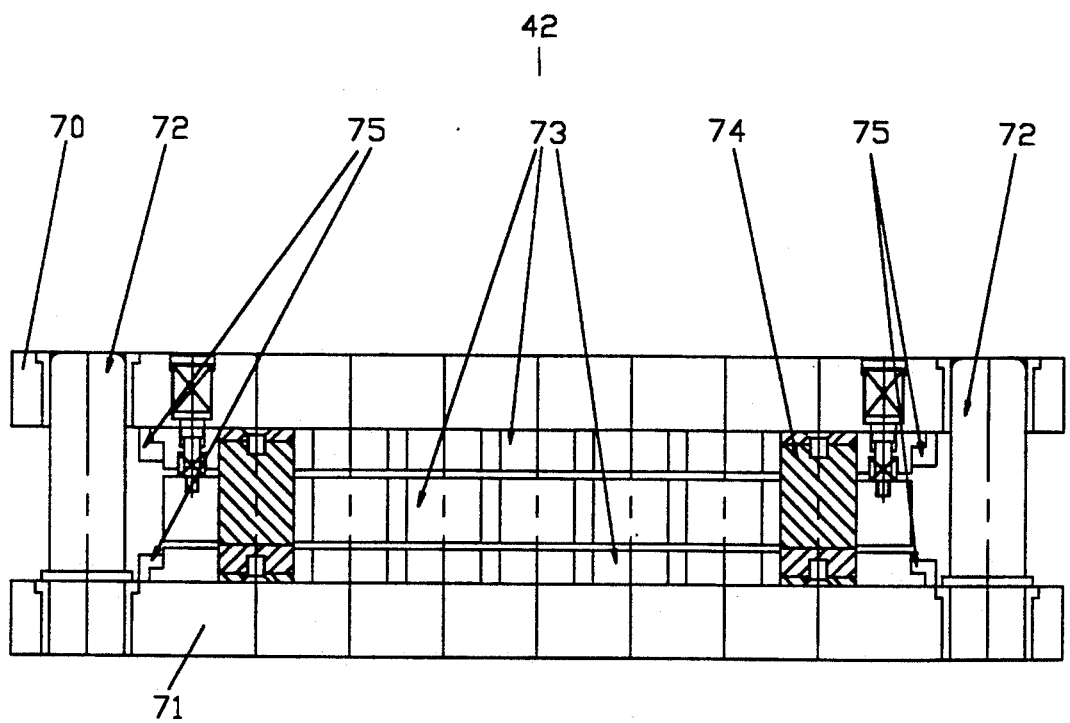
FIG. 4B is a detailed side cross-sectional view taken along the line A-A' of FIG. 4A.

FIG. 4A shows a top view of one of the stations of FIG. 2. FIG. 4B is a detailed side view of the station of FIG. 4A taken along the line A-A'. As shown in FIG. 4B, Station 42 includes a top plate 70 and bottom plate 71 for forming a cavity for receiving a removable die module generally indicated by reference numeral 73. The removable die module comprises a frame defining a plurality of cavities for receiving tool kits similar to the one indicated by reference numeral 74 for working on the semiconductor lead frames at the stations. Guide assemblies 72 secure the top plate and bottom plate to the station 42. As shown in FIG. 4A, the guide assemblies are located toward the rear of the station 42 to avoid obstructing the removal of the die module and the positioning of the lead frame by the changeable arm at the station. Clamps 75 further secure the removable die module. The die module can be easily removed to change tooling kits.

The tooling kits can be easily changed by simply removing the removable die module from the station and replacing the current tool kits with new ones. This enables the station to be reconfigured to perform a different task on the semiconductor lead frame, thereby creating a different product from the same semiconductor lead frame. Or, the apparatus can be reconfigured to process a new semiconductor lead frame with a different pitch distance by simply replacing the current dies modules at each station with new die modules having cavities which are spaced at the new pitch distance.

Also, the production rate can be increased or decreased by simply installing or removing tool kits in the die module 73. To maximize production, the number of tool kits installed in the die module is set equal to the number of individual circuits (packages) on the semiconductor lead frame such that the entire semiconductor lead frame can be processed simultaneously at each station.

To reduce the tooling cost, or to simply process a single circuit (package), only one tooling kit can be installed in the die module 73, such that only one individual circuit (package) is processed at a time at each station. In this configuration, only one circuit (package) on the semiconductor lead frame is processed during one cycle through the machine. To work the circuits (packages) in the other locations, the die module is removed, the tool kit is moved to a position in the die module corresponding to the pitch position of the next circuit (package), the die module is reinserted, and the semiconductor lead frame is cycled through the machine.

Figure 5:
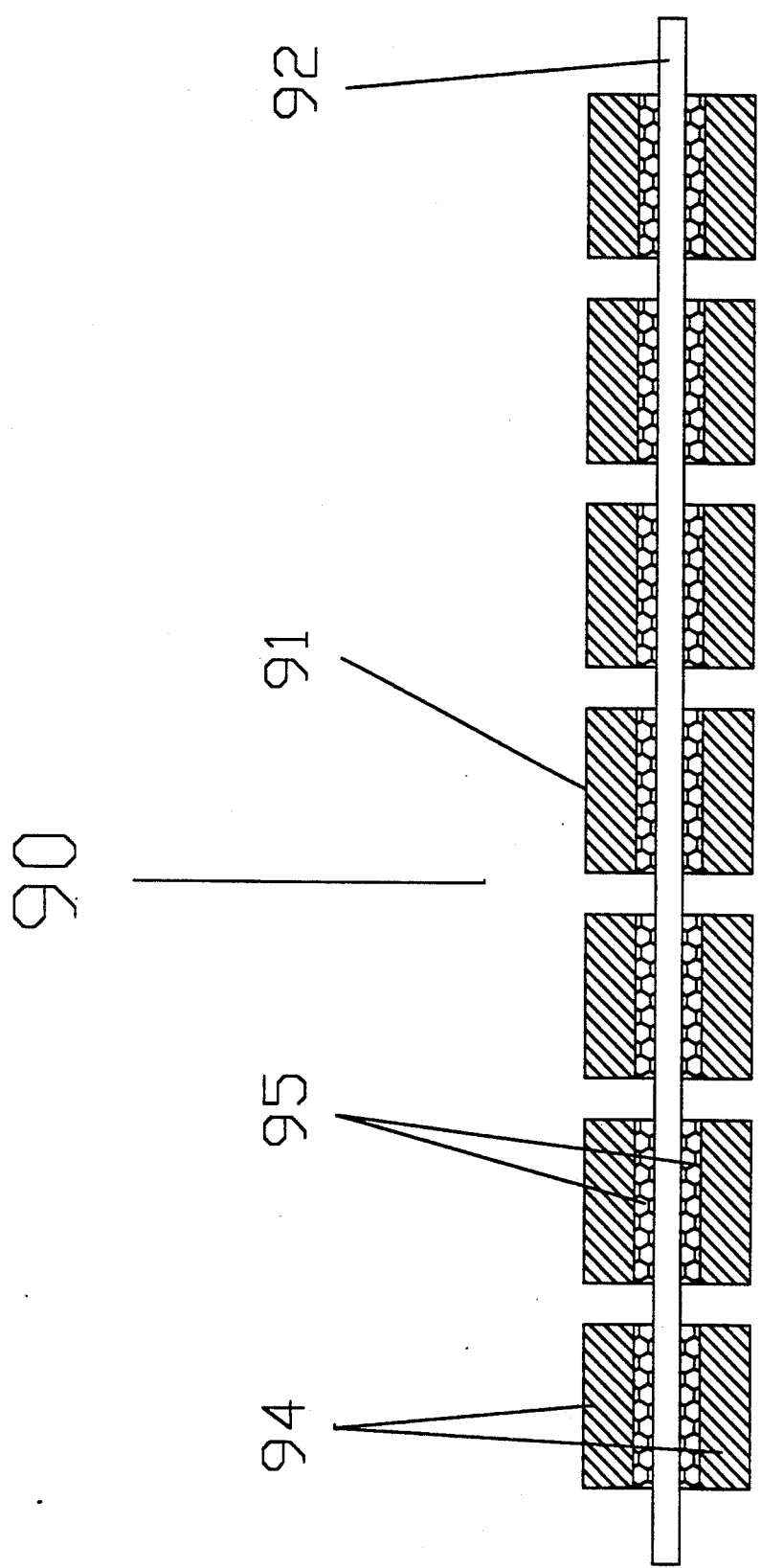
FIG. 5 shows a side view of an M-QUAD type lead frame which can be manufactured by the present invention.

The apparatus of the present invention can also be configured to assemble and process M-QUAD lead frames in one cycle. This can be done by simply installing at one of the stations special tools to manufacture M-QUAD lead frames. An M-QUAD lead frame is shown in FIG. 5 as indicated by reference numeral 90. The lead frame consists of metallic integrated circuit packages 91 adhered to a metallic base frame 92. Conductive leads (not shown) connect the packages to the lead frame. The metallic package 91 comprises 2 layers of a metallic material 94 and two layers of a composite glass material 95. The glass composite layer is used to bond the metallic layers to the base frame and isolate the packages from the frame.

As mentioned previously, the specific embodiments are exemplary, rather than exhaustive. Applicant is not limited to the specific embodiment(s) described above. Various changes and modifications can be made. For example, the number of processing stations can vary and the types of tools in the die modules at each station can vary. The claims, their equivalents and their equivalent language define the scope of protection.

What is claimed is:

1. An apparatus for processing semiconductor lead frame comprising:
    (a) a plurality of stations arranged in a substantially circular path for processing said lead frames;
    (b) processing means located at each end of said stations for processing a lead frame, said processing means including a die module removably secured to said stations, said die module comprising a frame defining a plurality of cavities for holding a plurality of tool kits for working on said lead frames; and
    (c) transferring means for transferring said lead frames between said stations.

2. An apparatus as in claim 1 further including input means for introducing said lead frames to said apparatus.

3. An apparatus as in claim 2 further including on-loading means for transporting said lead frames from said input means to one of said stations.

4. An apparatus as in claim 1 further including off-loading means for removing said lead frames from said plurality of stations.

5. An apparatus as in claim 1 wherein each of said stations and the processing means associated therewith are of a dimension sufficiently large to be able to process an entire lead frame simultaneously.

6. An apparatus as in claim I wherein each of said processing means at said stations includes means for performing any one of the following tasks: deflashing, dambaring, trimming, forming, marking, stamping, checking, singulating, lead conditioning, assembling, and packaging of said lead frames.

7. An apparatus as in claim 1 wherein said transferring means includes a rotatable mechanism positioned at a point substantially close to the center of said circular path, said mechanism having a plurality of wing arms for rotating said lead frames between said stations, and means for removing said lead frames from said stations and for positioning said lead frames at said stations.

8. An apparatus as in claim 7 wherein said removing and positioning means includes means for raising and lowering said lead frames.

9. An apparatus as in claim 1 further including a computer for controlling said processing.

10. An apparatus as in claim 1 wherein said processing means further includes a top plate, a bottom plate, and a guiding assembly, said top plate, bottom plate, and guiding assembly defining a centrally located cavity for housing said removably secured die module.

11. An apparatus as in claim 1 wherein each of said plurality of tool kits perform any one of the following tasks: deflashing, dambaring, trimming, forming, marking, stamping, checking, singulating, lead conditioning, assembling, and packaging said lead frames.

12. An apparatus as in claim 1 wherein said die module is secured to said station with releasable clamps.

13. An apparatus as in claim 10 wherein said processing means further includes guide pins for securing said top plate and said bottom plate to said station, said guide pins being located to avoid obstructing removal of said die module from said station and positioning of said lead frames at said station.

14. An apparatus as in claim 1 wherein one of said processing stations performs marking of said lead frames.

15. An apparatus for processing semiconductor lead frames comprising:
   (a) a plurality of stations arranged in a substantially circular path for processing said lead frames;
   (b) processing means located at said stations for processing said lead frames, said processing means including a die module removably secured to said stations, said die module comprising a frame defining a plurality of cavities for holding a plurality of tool kits for working on the lead frames; and
   (c) transferring means for transferring said lead frames between said stations, said transferring means comprising a rotatable mechanism positioned at a point substantially close to the center of said circular path, said mechanism having a plurality of wing arms for rotating said lead frames between said stations, and means for removing said lead frames from said stations and for positioning said lead frames at said stations, said removing and positioning means including means for raising and lowering said lead frames.

16. An apparatus as in claim 15 further including input means for introducing said lead frames to said apparatus.

17. An apparatus as in claim 15 further including on-loading means for transporting said lead frames from said input means to said plurality of stations.

18. An apparatus as in claim 15 further including on-loading means for removing said lead frames from said plurality of stations.

* * * * *